US008107632B2

(12) United States Patent
Yamada et al.

(10) Patent No.: US 8,107,632 B2

(45) Date of Patent: Jan. 31, 2012

(54) DIGITAL SIGNAL PROCESSING APPARATUS, METHOD THEREOF AND HEADPHONE APPARATUS

(75) Inventors: Yuji Yamada, Tokyo (JP); Koyuru Okimoto, Tokyo (JP)

(73) Assignee: Sony Corporation (JP)

( * ) Notice: Subject to any disclaimer, the term of this patent is extended or adjusted under 35 U.S.C. 154(b) by 1681 days.

(21) Appl. No.: 10/993,762

(22) Filed: Nov. 19, 2004

(65) Prior Publication Data

US 2005/0119772 A1 Jun. 2, 2005

(30) Foreign Application Priority Data

Nov. 28, 2003 (JP) ............................... P2003-400178

(51) Int. Cl.

| | |
|---|---|
| ***H04R 5/00*** | (2006.01) |
| ***H04R 1/10*** | (2006.01) |
| ***H04R 25/00*** | (2006.01) |
| ***H03G 3/00*** | (2006.01) |

(52) U.S. Cl. .................. 381/17; 381/1; 381/18; 381/61; 381/63; 381/74; 381/370

(58) Field of Classification Search ................ 381/1, 74, 381/370, 66, 17–23, 61–63, 300–309

See application file for complete search history.

(56) References Cited

U.S. PATENT DOCUMENTS 5,081,604 A * 1/1992 Tanaka .......................... 708/319

FOREIGN PATENT DOCUMENTS

| | | |
|---|---|---|
| JP | 01-144814 | 6/1989 |
| JP | 03-127599 | 5/1991 |
| JP | 08-182100 | 7/1996 |
| JP | 11-331992 | 11/1999 |
| JP | 11331992 A | * 11/1999 |
| JP | 2000-050399 | 2/2000 |

* cited by examiner

*Primary Examiner* — Devona Faulk

(74) *Attorney, Agent, or Firm* — Lerner, David, Littenberg, Krumholz & Mentlik, LLP

(57) ABSTRACT

A digital signal processing apparatus in which a first digital filter reproduces that part of an impulse response that responds fast, and a decimation filter converts the output of a delay device of the first digital filter to a digital signal having a sampling rate of ½. The digital signal is supplied to the second digital filter that reproduces that part of the impulse response that responds slowly and outputs data representing the response characteristic of this part of the impulse response. An interpolation filter converts an input signal to a signal having the same sampling rate as the digital audio signal input to the digital signal processing apparatus, and the output signal of the interpolation filter is supplied to an adder circuit.

13 Claims, 16 Drawing Sheets

3L (3R)

IMPULSE RESPONSE

IMPULSE RESPONSE

DIGITAL SIGNAL PROCESSING APPARATUS, METHOD THEREOF AND HEADPHONE APPARATUS

CROSS-REFERENCE TO RELATED APPLICATIONS

This application claims priority of Japanese Patent Application No. P2003-400178, filed Nov. 28, 2003, the entirety of which is incorporated by reference herein.

BACKGROUND OF THE INVENTION

1. Field of the Invention

The present invention relates to a digital signal processing apparatus and method thereof, which reproduce impulse responses on the basis of the characteristic of the signal transfer between two broadcasting systems. The invention also relates to a headphone apparatus in which the apparatus and method are used.

2. Description of the Related Art

When an audio signal is supplied to a speaker and the speaker playback the music, the resultant acoustic image lies in front of the listener. When the same audio signal is supplied to the headphone that the listener wears, the acoustic image lies in the listener's head. This is extremely unnatural positioning of the acoustic image.

A headphone apparatus that positions the acoustic image outside the listener's head has been proposed, as is disclosed in Japanese Patent Application Laid-Open Publication No. 11-331992 corresponding to a Japanese patent application filed by the assignee of the present application. FIG. 1 illustrates such a headphone apparatus. As shown in FIG. 1, an analog audio signal SA is supplied via the input terminal 1 to an A/D converter circuit 2, which converts the audio signal to a digital audio signal SD. The signal SD is supplied to digital signal processing circuits 3L and 3R. These processing circuit 3L and 3R process the signal SD so that the resultant acoustic image may lie outside the listener's head.

If a sound source SP is located in front of a listener M as shown in FIG. 2, the sound output from the source SP is transferred to the listener's left and right ears though a path that has transfer functions HL and HR.

In the digital signal processing circuits 3L and 3R, the impulse responses obtained by converting the transfer functions HL and HR to time axes are convoluted in the signal SD. The impulse responses can be either measured or calculated.

Performing this convolution, the digital signal processing circuit 3L generates a signal, and so does the digital signal processing circuit 3R. The signal generated by the circuit 3L is supplied to a D/A converter 4L, which converts the signal to an analog audio signal SA. Similarly, the signal generated by the circuit 3R is supplied to a D/A converter 4R, which converts the signal to an analog audio signal SA. The analog audio signals SA are supplied via headphone amplifiers 5L and 5R to the left and right acoustic units (electro-acoustic transducer) 6L and 6R of a headphone 6, respectively.

The sound reproduced by the headphone 6 is therefore one coming through the path that has transfer functions HL and HR. When the listener M wearing the headphone 6 listens to the sound, he or she feels that the acoustic image SP lies outside his or her head as is illustrated in FIG. 2.

To provide the transfer functions HL and HR, the digital signal processing circuits 3L and 3R have such a FIR filter configuration as shown in FIG. 3. In this configuration, the digital audio signal SD generated by the A/D converter circuit 2 (FIG. 1) is supplied via the input terminal 31 to a plurality of delay circuits 3D that are connected in series. The signal output from the input terminal 31 is supplied to a multiplier circuit 3M. The signals output from the delay circuits 3D are supplied to other multiplier circuits 3M, respectively. The outputs of the multipliers 3M are output to the output terminal 37 via adder circuits 3A, respectively.

Each delay circuit 3D delays the digital audio signal SD by one-sampling period (unit period) $\tau$. Each multiplier circuit 3M has, as a coefficient, the impulse response at any time when the transfer function HL or HR is converted to a time axis.

It is therefore necessary to use many taps (i.e., orders) in the digital signal processing circuits 3L and 3R, both shown in FIG. 3. That is, the circuits 3L and 3R must have many delay circuits 3D and many multiplier circuits 3M. For example, 1024 delay circuits and 1024 multiplier circuits must be incorporated in either digital signal processing circuit.

If the digital signal processing circuits 3L and 3R are constituted by a DSP each, they will need a large-capacity memory for the delay circuits 3D. Inevitably, the IC scale of circuits 3L and 3R becomes large, proportionally increasing the manufacturing cost of the circuits 3L and 3R. Further, the process steps increase because the circuits 3L and 3R require a great number of multiplier circuits 3M each. Consequently, signals must be processed at high speed in the circuit 3L and 3R. This raises the operating cost of the digital signal processing circuits 3L and 3R.

SUMMARY OF THE INVENTION

The present invention has been made in view of the foregoing. An object of the invention is to provide a digital signal processing apparatus and method thereof, in which the number of the filter taps, i.e., delay circuits and multiplier circuits, can be greatly reduced.

Another object of this invention is to provide a headphone apparatus that can be manufactured at low cost by the use of an apparatus and method for processing digital signals, in which the number of the filter taps, delay circuits and multiplier circuits can be greatly reduced.

A digital signal processing apparatus according to this invention is designed to reproduce an impulse response that represents an acoustic transfer characteristic. The apparatus comprises: digital filters, one of which reproduces, at a sampling rate, a first response part representing a direct acoustic part of the impulse response, and another of which reproduces, at a different sampling rate, a second response part representing a non-direct acoustic part of the impulse response; and a sampling-rate changing filter which generates a delay time, upon lapse of which a reflected acoustic part in the second response part is started.

A digital signal processing method according to the present invention is designed to reproduce an impulse response that represents an acoustic transfer characteristic. The method comprises: driving digital filters, one of which reproduces, at a sampling rate, a first response part representing a direct acoustic part of the impulse response, and another of which reproduces, at a different sampling rate, a second response part representing a non-direct acoustic part of the impulse response; and driving a sampling-rate changing filter, which generates a delay time, upon lapse of which a reflected acoustic part in the second response part is started.

A headphone apparatus according to this invention has a digital signal processing apparatus for reproducing an impulse response that represents an acoustic transfer characteristic. The digital signal processing apparatus comprises: digital filters, one of which reproduces, at a sampling rate, a first response part representing a direct acoustic part of the impulse response, and another of which reproduces, at a different sampling rate, a second response part representing a non-direct acoustic part of the impulse response; and a sampling-rate changing filter which generates a delay time, upon lapse of which a reflected acoustic part in the second response part is started.

In the apparatus and method for processing digital signals, according to this invention, two digital filters having different sampling rates reproduce a first response part and a second response part, respectively. The first response part represents the direct acoustic part of an impulse response. The second response part represents the non-direct acoustic part of the impulse response. The reflected acoustic part included in the second response part is delayed by a delay time generated by a sampling-rate changing filter. Hence, the number of taps of each digital filter can be reduced. The circuit size of each digital filter can therefore be decreased to lower the manufacturing cost and power consumption of each digital filter. The headphone apparatus or a speaker apparatus, which incorporates the digital filters, can be manufactured at low cost.

DETAILED DESCRIPTION OF THE PREFERRED EMBODIMENTS

The best mode of carrying out this invention is a headphone apparatus that incorporates a digital signal processing apparatus according to the invention. The headphone apparatus is designed to provide an acoustic image outside the wearer's head. In the digital signal processing apparatus incorporated in the headphone apparatus, the number of the filter taps, i.e., delay circuits and multiplier circuits, can be greatly reduced.

Figure 4:
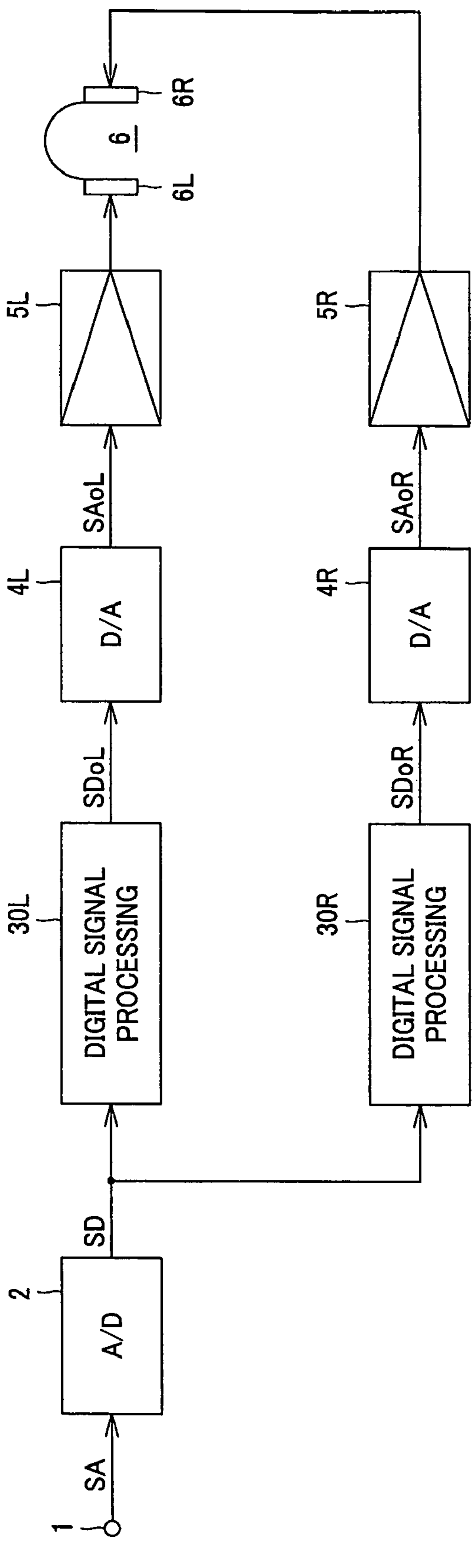
FIG. 4 is a block diagram of a headphone apparatus according to the present invention.

FIG. 4 is a block diagram of the headphone apparatus. As shown in FIG. 4, an analog audio signal SA is supplied via the input terminal 1 to an A/D converter circuit 2, which converts the signal SA to a digital audio signal SD. The signal SD is supplied to digital signal processing circuits 30L and 30R. In the digital signal processing circuits 30L and 30R, impulse responses equivalent to transfer functions HL and HR are convoluted in the signal SD. The transfer function HL represents the transfer characteristic of a path that extends from a sound source where an acoustic image should be located, to the left ear of the listener. The transfer function HR represents the transfer characteristic of a path that extends from the sound source to the right ear of the listener. The impulse responses can be either measured or calculated. The impulse responses have been obtained by converting the transfer functions HL and HR to time axes.

Figure 5:
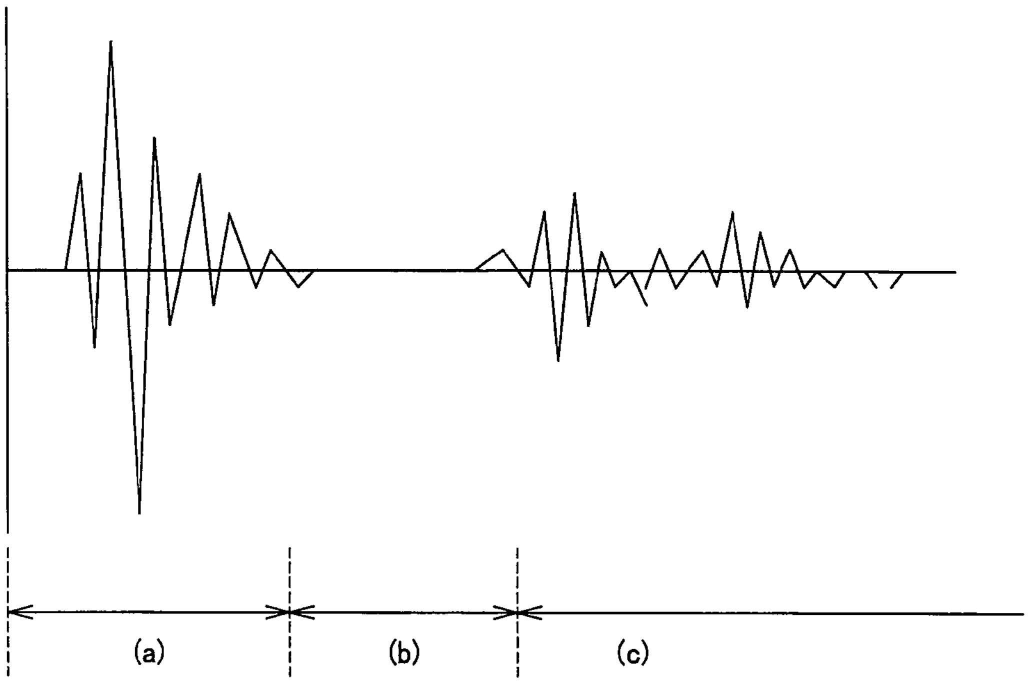
FIG. 5 is a characteristic diagram representing an impulse response.

An impulse response, which is the response to a small impulse having a sufficiently small width, will be briefly explained. The impulse response that propagates from a sound source to both ears of a listener in, for example, a listening room is regarded as consisting of three parts as is illustrated in FIG. 5. The first part (a) (direct acoustic part) directly propagates from the sound source to the listener's ears. The second part (b) (anacoustic part) has an impulse response level that remains almost nil until the sound reflected reaches the listener's ears. The third part (c) (reflected acoustic part) is reflected by the wall, ceiling or the like of the room and then reaches the listener's ears. The impulse response characteristic of FIG. 5, which will be later described in detail, may also be regard as consisting of the following two response parts. The first response part (a) is the direct acoustic part. The second response part (b)+(c) is the non-direct acoustic part. The second response part is composed of an anacoustic part (b) and a reflected acoustic part (c). The reflected acoustic part (c) is delayed with respect to the direct acoustic part (a), by the duration of the anacoustic part (b).

In the headphone apparatus, the digital signal processing circuits 30L and 30R have a digital filter each. The digital filters have different sampling rates. The digital filter of the circuit 30L and the digital filter of the circuit 30R reproduce the first response part and the second response part, respectively. The first response part represents the direct acoustic part of the impulse response, and the second response part represents the non-direct acoustic part of the impulse response. The reflected acoustic part of the second response part is delayed by a filter that has a specific delay time.

The digital signal processing circuit 30L convolutes an impulse response equivalent to transfer function HL, in the signal SD, generating a signal SDoL. Similarly, the digital signal processing circuit 30R convolutes an impulse response equivalent to transfer function HR, in the signal SD, generating a signal SDoR. The signals SDoL and SDoR are supplied to the D/A converter circuits 4L and 4R, respectively. The circuit 4L converts the signal SDoL to an analog audio signal SAoL. The circuit 4R converts the signal SDoR to an analog audio signal SAoR. The signal SAoL is supplied via a headphone amplifier 5L to the left acoustic unit 6L of a headphone 6. The signal SAoR is supplied via a headphone amplifier 5R to the right acoustic unit 6R of the headphone 6.

Hence, the headphone 6 reproduces sound that has passed through a path having the transfer functions HL and HR. The sound reproduced therefore forms an acoustic image that lies outside the head of the listener M who wears the headphone 6.

Figure 6:
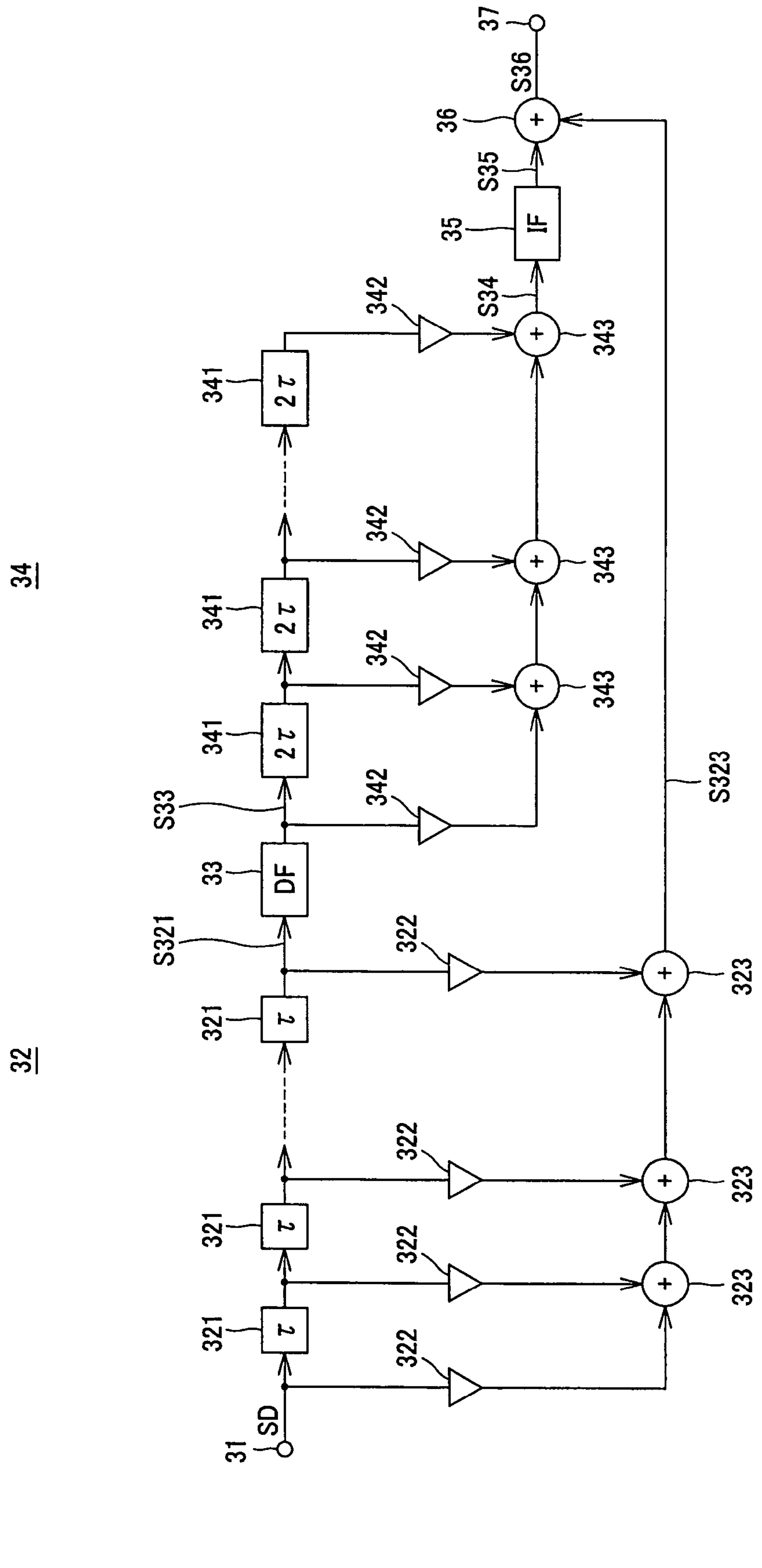
FIG. 6 is a circuit diagram the digital signal processing circuit incorporated in the headphone apparatus.

The digital signal processing circuits 30L and 30R incorporated in the headphone apparatus have the same structure, which is shown in FIG. 6. In each digital signal processing circuit, the first digital filter 32 having the first sampling rate reproduces the first response part of the impulse response. The second digital filter 34 having the second sampling rate reproduces the second response part of the impulse response. The second sampling rate is 1/n (n is 2 or greater) of the first sampling rate. The first digital filter 32 and the second digital filter 34 are connected in series. A down-sampling filter 33 is connected to and between the first and second digital filters 32 and 34. The filter 33 decreases the first sampling rate to the second sampling rate. An up-sampling filter 35 is connected to the output of the second digital filter 34. The up-sampling filter 35 increases the second sampling rate back to the first sampling rate. The down-sampling filter 33 and the up-sampling filter 35 provide a delay time, which is used to delay the reflected acoustic part of the second response part.

The digital audio signal SD is supplied via an input terminal 31 to the first digital filter 32. The first digital filter 32 reproduces the direct acoustic part (a) shown in FIG. 5, which responds faster than the other part of the impulse response. The first digital filter 32 outputs data representing the response characteristic and delay time of the direct acoustic part (a).

In the first digital filter 32, the signal SD from the terminal 31 is supplied to a prescribed number of delay circuits 321 that are connected in series. A signal S321 is output from the last delay circuit 321. The signal SD is supplied to a multiplier circuit 322, too. The output of the multiplier circuit 322 is supplied to an adder circuit 323. The outputs of the delay circuits 321 are supplied to other multiplier circuits 322, each to one multiplier circuit 322. The output of the multiplier circuits 322 are supplied to adder circuits 323, each to one adder circuit 323. Each adder circuit 323 adds the two inputs. Any adder circuit 323, except the last, outputs the sum of two inputs to the next adder circuit 323. The last adder circuit 323 generates a signal S323.

The delay circuits 321 delay the digital audio signal SD by the sampling period (unit time) τ. The multiplier circuits 322 have a coefficient each. The coefficient is the impulse response of the direct acoustic part, which is equivalent to the transfer function HL or HR. If the sampling frequency of the signal SD is 48 kHz, for example, the first digital filter 32 has 40 to 200 taps.

The signal S321 is therefore a signal obtained by delaying the analog audio signal SA by the time equal to the duration of the direct acoustic part of the impulse response to be reproduced. Hence, the signal S321 has a high-band component and a low-band component. The signal S323 corresponds to that part of the impulse response, which responds faster than the other part. The greater part of the signal S323 is therefore the high-band component of the analog audio signal SA.

The signal S321 output by the last delay circuit 321 is supplied to the down-sampling filter 33, or decimation filter. The down-sampling filter 33 converts the signal S321 to a digital signal S33 having a sampling rate 1/n (n is 2 or greater), for example ½. Namely, that part of the signal S321, which corresponds to the low-band component of the signal SA, is extracted as signal S33.

The signal S33 is supplied to the second digital filter 34. The second digital filter 34 reproduces the reflected acoustic part (c) in FIG. 5 of the impulse response to be reproduced, which responds more slowly than the other part of the impulse response. The second digital filter 34 outputs data representing the response characteristic and delay time of the reflected acoustic part (c).

In the second digital filter 34, the signal S33 generated by the down-sampling filter 33 is supplied to a prescribed number of delay circuits 341 that are connected in series. The signal S33 is supplied to a multiplier circuit 342, too. The output of the multiplier circuit 342 is supplied to an adder circuit 343. The outputs of the delay circuits 341 are supplied to other multiplier circuits 342, each to one multiplier circuit 342. The output of the multiplier circuits 342 are supplied to other adder circuits 343, each to one adder circuit 343. Each adder circuit 323 adds the two inputs. Any adder circuit 343, except the last, outputs the sum of two inputs to the next adder circuit 323. The last adder circuit 343 generates a signal S34.

The delay circuits 341 delay the digital audio signal S33 by the sampling period (unit time) 2τ, because n=2. The multiplier circuits 342 have a coefficient each. The coefficient is the impulse response that the low-band component of the signal SA has if the transfer function HL or HR is converted to a time axis. If the sampling frequency of the signal SD is 48 kHz, for example, the second digital filter 34 has 400 taps to thousands of taps.

Therefore, the signal S34 corresponds to that part of the impulse response of the FIR filter, which responds more slowly than the other part. The greater part of the signal S34 is therefore the low-band component of the analog audio signal SA.

The signal S34 is supplied to the up-sampling filter 35, or interpolation filter, which has the same sampling rate as the digital audio signal SD. The signal S34 is supplied to an adder circuit 36. The signal S323 output from the first digital filter 32 is supplied to the adder circuit 36, too. The adder circuit 36 adds the two inputs, generating a signal S36. The signal S36 is output from the output terminal 37 of the digital signal processing circuit.

As indicated above, the signal S321 output by the last delay circuit 321 is supplied to the second digital filter 34 after it is converted to a digital signal S33 having a sampling rate 1/n (n is 2 or greater, e.g., 2) by the decimation filter 33. The reason why the signal S321 should be so converted will be explained.

If a digital filter is a FIR filter, the number of taps it needs to reproduce the frequency characteristic of any signal passing through it depends upon the frequency band assigned to it. The higher the frequency band, the smaller the number of taps required. Conversely, the lower the frequency band, the larger the number of taps.

This means that the high-band component of the analog audio signal SA is that part of the output of the FIR filter, which responds quickly. The part of the output of the FIR filter, which responds slowly, can provide a high-fidelity impulse response only if the low-band component of the analog audio signal SA is reproduced.

The decimation filter 33 converts the signal S321 to a digital signal S33 having a sampling rate of, for example, ½. The digital signal S33 is supplied to the second digital filter 34. The second digital filter 34 reproduces that part of the impulse response, which responds slowly (i.e., the reflected acoustic part (c) shown in FIG. 5). The filter 34 then outputs data representing the response characteristic of reflected acoustic part (c). That part of the output of the FIR filter, which responds quickly, is processed at the first sampling rate, whereas that part of the FIR filter, which responds slowly, is processed at the second sampling rate that is 1/n of the first sampling rate. Hence, the number of taps that the decimation filter 33 must have is smaller than otherwise.

The sampling-rate changing filter, or the combination of the decimation filter 33 and interpolation filter 35, has the function of providing the anacoustic part (b) that is interposed between the direct acoustic part (a) and the reflected acoustic part (c) shown in FIG. 5. In other words, the reflected acoustic part included in the second response part is delayed by the delay times generated by the decimation filter 33 and interpolation filter 35 of a sampling-rate changing filter. Still in other words, the anacoustic part (b), i.e., second response part, is generated by using the delay time generated by the decimation filter 33 and interpolation filter 35.

The direct acoustic part, anacoustic part and reflected acoustic part of the impulse response will be explained in detail, with reference to FIG. 5 illustrating the impulse response that propagates from a sound source to both ears of a listener in the listening room. As described above, the impulse response consists of three consecutive parts. The first part is a direct acoustic part (a) shown in FIG. 5 that directly propagates from the sound source to the listener's ears. The second part is an anacoustic part (b) shown in FIG. 5 that has an impulse response level remaining almost zero until the sound reflected reaches the listener's ears. The third part is a reflected acoustic part (c) shown in FIG. 5 that is reflected by the wall, ceiling or the like of the listening room and then reaches the listener's ears.

In view of response time and frequency characteristic, the direct acoustic part (a) has a broad frequency band similar to that of the sound source, because it scarcely degrades the frequency characteristic. By contrast, the reflected acoustic part (c) degrades the frequency characteristic, particularly high-band characteristic, because it has been reflected by the wall, ceiling or the like of the listening room. Therefore, that part of the impulse response, which responds quickly, must be reproduced from both the high- and low-band component of the analog audio signal SA. On the other hand, that part of the impulse response, which responds slowly, may be reproduced from only the low-band component of the analog audio signal SA. Consisting of these parts, the impulse response can have, as a whole, high fidelity.

Consider the impulse response propagating from the sound source to both ears of the listener in the listening room. That part of the impulse response, which is almost anacoustic (i.e., part (b) shown in FIG. 5) has a very low impulse level. Hence, it is necessary to reproduce only the delay time for this part of the impulse response.

Figure 7:
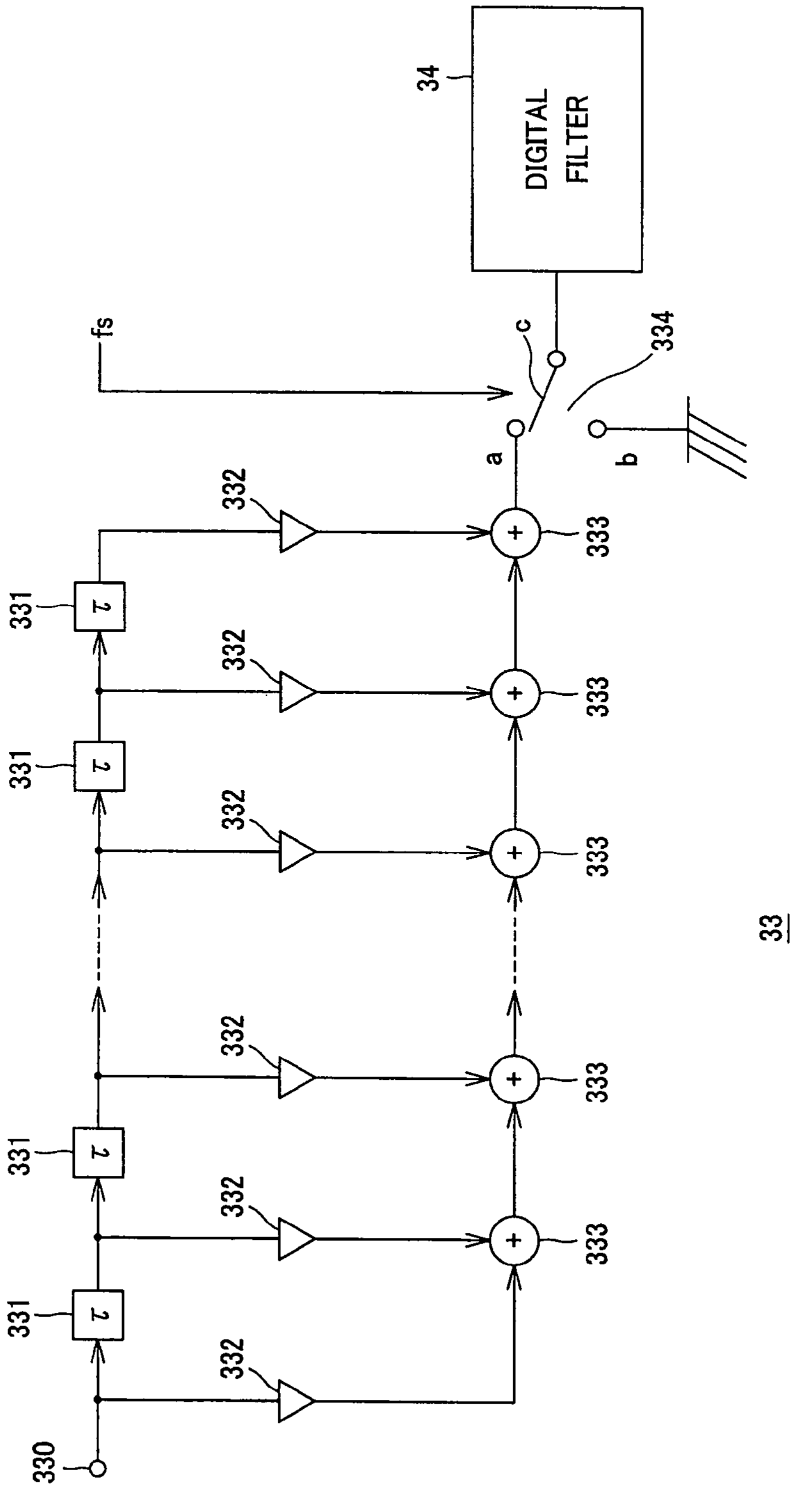
FIG. 7 is a circuit diagram of a decimation filter.

The decimation filter 33 is such a FIR filter as illustrated in FIG. 7. The signal S321 output from the delay circuit 321 of the first digital filter 32 is supplied via the input terminal 330 to a plurality of delay circuits 331 that are connected in series. The signal S321 is supplied from the input terminal 330 to a multiplier circuit 332. The outputs of the delay circuits 331 are supplied to other multiplier circuits 332, each to one multiplier circuit 332. The output of the first multiplier circuit 332 and the output of the second multiplier circuit 332 are supplied to an adder circuit 333. The outputs of the remaining multiplier circuits 332 are supplied to other adder circuits 333, each to one adder circuit 333. The output of any adder circuit 333, except the last, is supplied to the next adder circuit. The last adder circuit 333 is supplied to the stationary contact a that a switch 334 has. The other stationary contact b that the switch 334 has is connected to the ground. The movable contact c of the switch 334 is connected to the second digital filter 34. The movable contact c is switched at sampling frequency fs. Hence, the switch 334 supplies a digital signal S33 having sampling rate ½ to the second digital filter 34. Note that the decimation filter 33 is an LPF that has a cutoff frequency fc of 10 kHz. The coefficients of the multiplier circuits 332 are set in the decimation filter 33. In the decimation filter 33, the delay circuits 331 connected in series have constant delay characteristics, regardless of the frequency band. If the decimation filter 33 has taps in an odd number, the coefficients of the multiplier circuits 332 of one group are symmetrical to those of the multiplier circuits 332 of the other group, with respect to the {(odd number+1)/2}th multiplier circuit. Even if the decimation filter 33 has taps in an even number, the coefficients of the multiplier circuits 332 of one group are symmetrical to those of the multiplier circuits 332 of the other group. That is, the multiplier circuits 332 have the same group-delay characteristic. The group-delay characteristic will be explained later.

Figure 8:
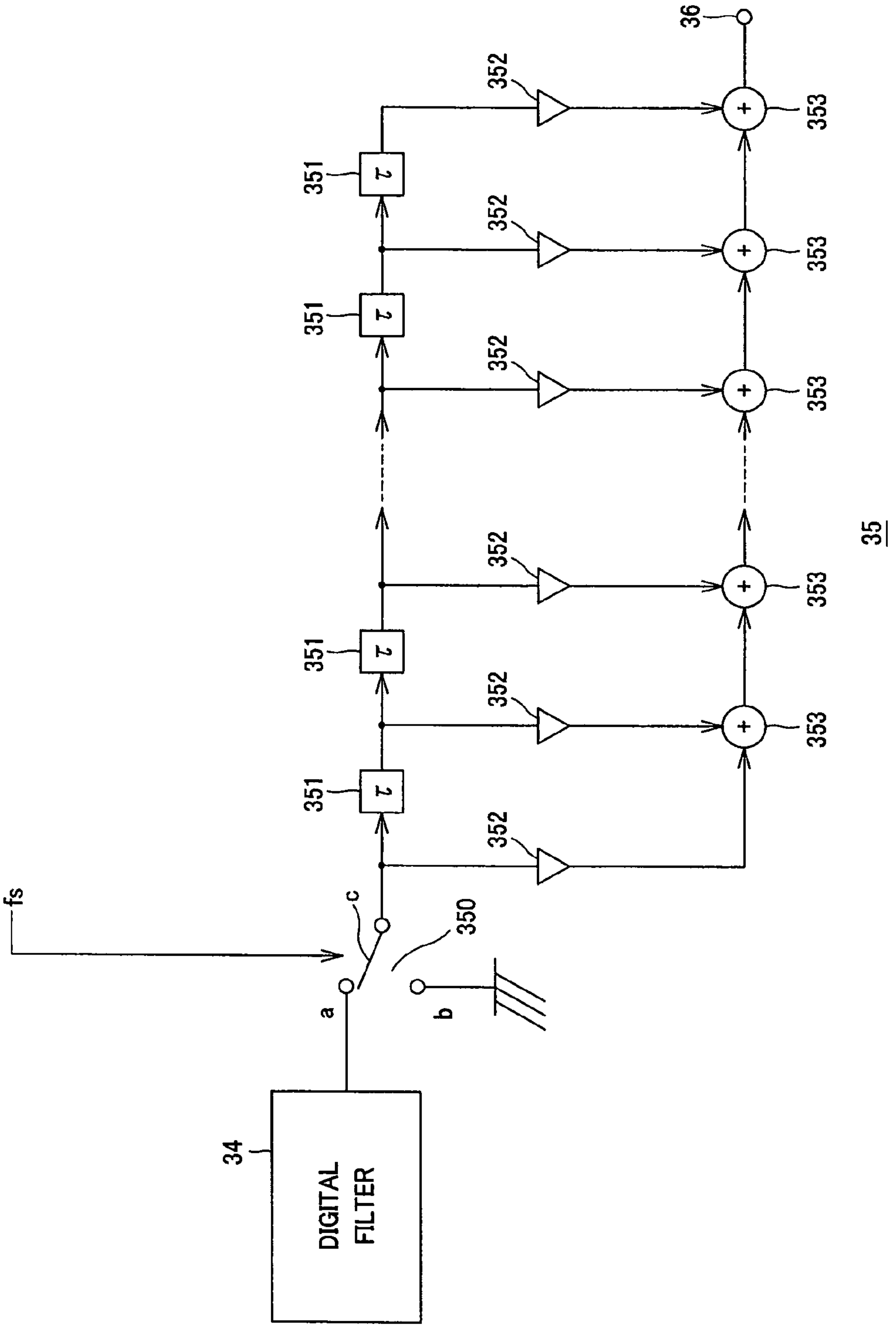
FIG. 8 is a circuit diagram of an interpolation filter.

The interpolation filter 35 is such a FIR filter as depicted in FIG. 8. The signal S34 generated by the digital filter 34 is supplied via a stationary contact a of switch 350 to a plurality of delay circuits 351 that are connected in series. The signal S34 is supplied to a multiplier circuit 352, too. The outputs of the delay circuits 351 are supplied to other multiplier circuits 352, each to one multiplier circuit 352. The output of the first multiplier circuit 352 and the output of the second multiplier circuit 352 are supplied to an adder circuit 353. The outputs of the remaining multiplier circuits 352 are supplied to other adder circuits 353, each to one adder circuit 353. The output of any adder circuit 353, except the last, is supplied to the next adder circuit. The last adder circuit 353 is supplied to the output terminal 36. The switch 350 has another stationary contact b, which is connected to the ground. The movable contact c is switched at sampling frequency fs. Hence, the switch 350 converts the output of the digital filter 34 to a signal S35 that has the same sampling rate as the digital audio signal SD. The signal S35 is supplied to the output terminal 36. Note that the interpolation filter 35 is also an LPF that has a cutoff frequency fc of 10 kHz. As in the decimation filter 33, the delay circuits 351 connected in series have constant characteristics, regardless of the frequency band. If the interpolation filter 35 has taps in an odd number, the coefficients of the multiplier circuits 352 of one group are symmetrical to those of the multiplier circuits 332 of the other group, with respect to the {(odd number+1)/2}th multiplier circuit. Even if the interpolation filter 35 has taps in an even number, the coefficients of the multiplier circuits 352 of one group are symmetrical to those of the multiplier circuits 352 of the other group. That is, the multiplier circuits 352 have the same group-delay characteristic.

Figure 9:
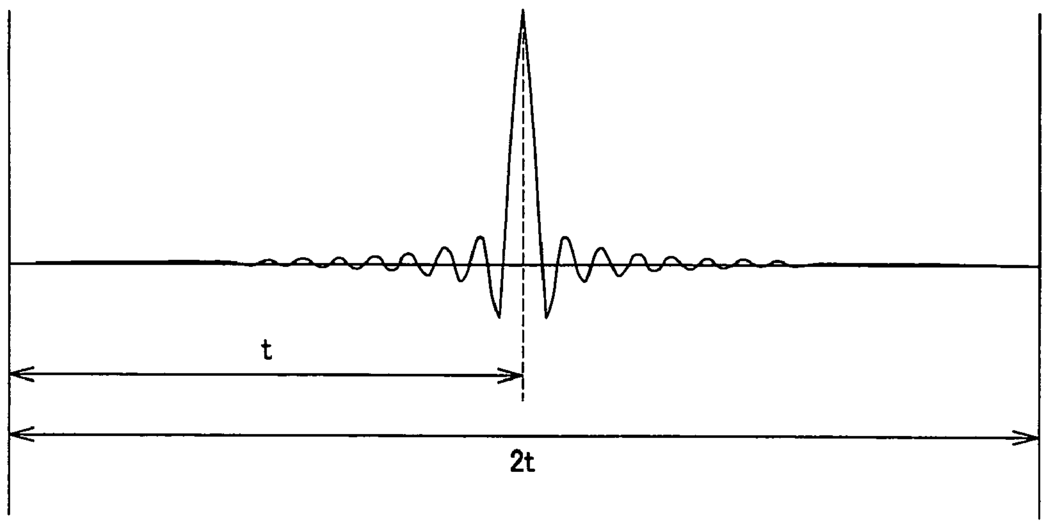
FIG. 9 is a characteristic diagram representing the impulse response of a FIR filter that has constant group-delay time.

FIG. 9 shows the impulse response of a FIR filter that is used as the decimation filter 33 and the interpolation filter 35. This impulse response has the frequency characteristic of a 10-kHz cutoff LPF and the coefficient defining constant group-delay characteristic.

Constant group-delay characteristic means two things. First, the delay characteristic is constant, irrespective of the frequency band. Second, the multiplier circuits of one group are symmetrical to the multiplier circuits 352 of the other group, in terms of multiplication coefficient, if the filter has taps in an odd number. If the filter has taps in an even number, the two groups of multiplier circuits are, of course, symmetrical in terms of multiplication coefficient.

As seen from, for example, FIG. 9, a FIR filter having 2t taps has a group-delay time that corresponds to t taps. If this FIR filter is a 10-kHz cutoff LPF that has 100 taps and constant group-delay characteristic, the decimation filter 33 and the interpolation filter 35 will have 50 taps each and a delay time of about 1 msec each. The total delay time of these filters 33 and 35 will be 2 msec. Hence, the delay time determined by the group-delay characteristic of the FIR filter may be made equal to the duration of the anacoustic part of the impulse response. Then, the decimation filter and the interpolation filter cannot only perform down sampling, but also reproduce the impulse response of the anacoustic part of the impulse response.

As explained in the preceding paragraph, the delay time of the FIR filter, i.e., the decimation filter or the interpolation filter, may be made equal to the duration of the anacoustic part of the impulse response. Instead, the delay time of the FIR filter may be rendered shorter than the duration of the anacoustic part of the impulse response. If this is the case, the reflected acoustic part of the impulse response, which has been down-sampled, will make up for the insufficiency of the delay time of the FIR filter.

In this configuration, the digital filter 32 of FIG. 6 convolutes the impulse response, which is equivalent to the direct acoustic part having the transfer function HL or HR, in the direct acoustic part of the analog audio signal SA. The digital filters 32 and 34 shown in FIG. 6 convolutes the impulse response, which is equivalent to the reflected acoustic part having the transfer function HL or HR, in the reflected acoustic part of the analog audio signal SA. The down-sampling filter 33 and the interpolation filter 35 convolute the impulse response, which is equivalent to the anacoustic part.

The signal S323 pertaining to the direct acoustic part and the signal S34 pertaining to the anacoustic part and reflected acoustic part are supplied to the adder circuit 36 and are added. The signal S36 output from the adder 36 is a signal generated by convoluting an impulse response in the analog audio signal SA, the impulse response having been obtained by converting the transfer functions HL and HR to time axes.

The signal S36 is the output of the digital signal processing circuits 30L or 30R. As explained with reference to FIG. 4, the signal S36 is supplied to the D/A converter circuit 4L or 4R. When the headphone 6 reproduces the analog audio signal SA, the acoustic image defined by the signal SA can lie outside the listener's head.

Thus, the digital signal processing circuits 30L and 30R can serve to provide an acoustic image outside the listener's head when the headphone 6 reproduces the analog audio signal SA. The digital filters 32 and 43 perform convolution on the direct acoustic part of the signal SA to provide an acoustic image outside the listener's head. Since the sampling rate of the digital filter 34 is decreased to half (½) the original rate, the number of taps the filter 34 has can be reduced. Further, the down-sampling filter 33 and the interpolation filter 35 can reproduce the impulse response of the anacoustic part, the number of taps the digital filter 34 has can be reduced.

Figure 1:
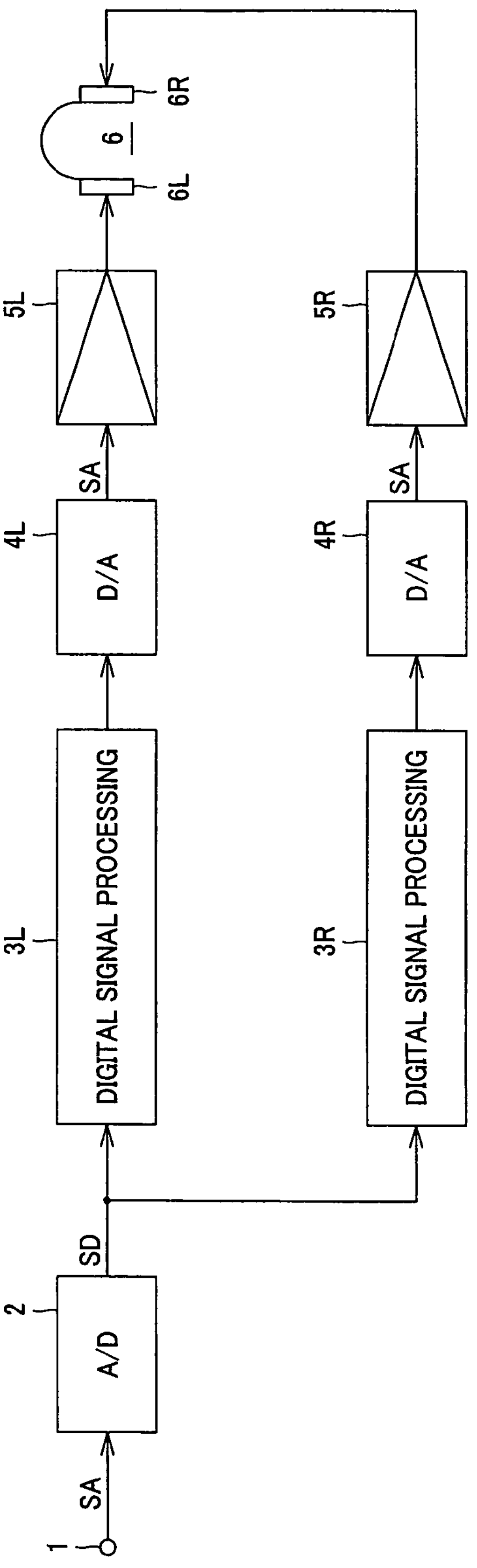
FIG. 1 is a block diagram of a conventional headphone apparatus.
Figure 2:
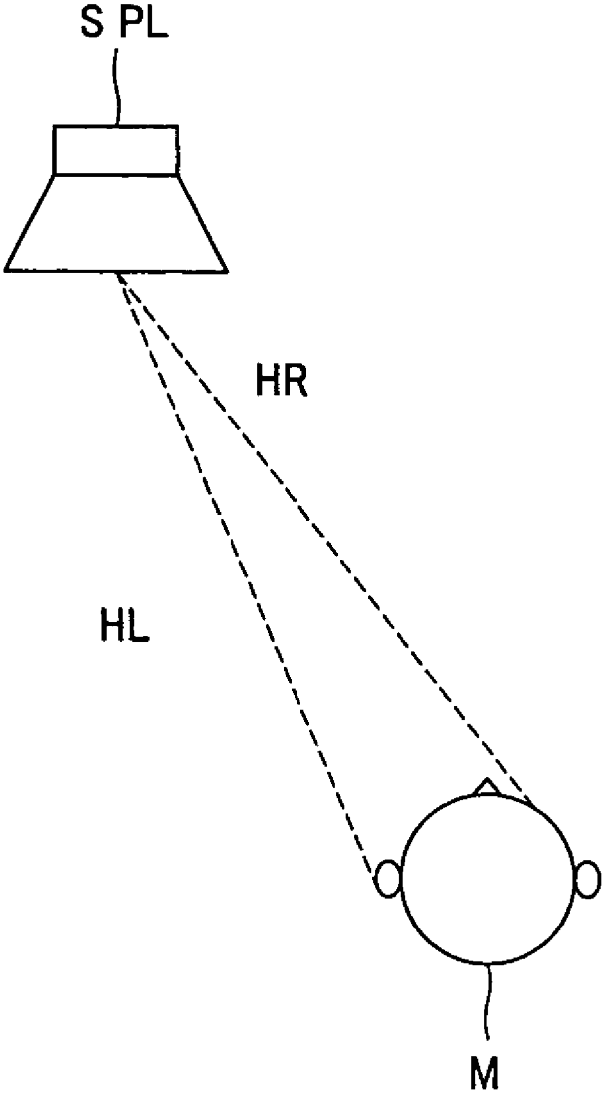
FIG. 2 is a diagram showing a sound source SPL arranged at a front-left position of a listener M.
Figure 3:
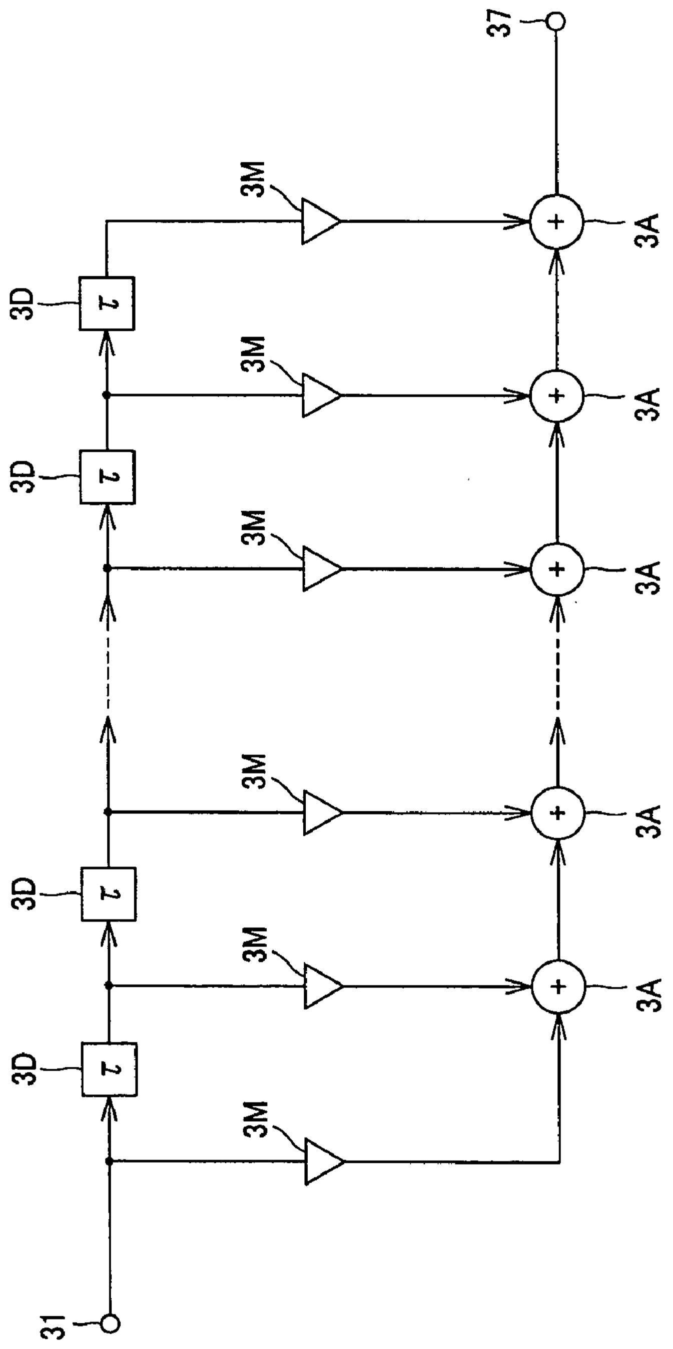
FIG. 3 is a circuit diagram of a conventional digital filter.

The digital filter 34 will have 896 taps (=1024−128) if the digital filters constituting the digital signal processing circuits 3L and 3R have 1024 taps as specified with reference to FIG. 3, and if the digital filter 32 shown in FIG. 6 has 128 taps.

Nonetheless, the number of taps of the digital filter 34 can be ½ since the sampling frequency is ½, if the response time remains unchanged. The number of taps can be reduced to 448. As a result, the total number of taps that the digital filters 32 and 34 have can decrease to 576 (=128+488).

Assume that the data supplied to the 100th to 200th taps are anacoustic data. Then, the digital filter 32 has 100 taps, and the decimation filter 33 and interpolation filter 35 have 100 taps each, if the their group delays are constant, each being about 1 ms. Since the digital filter 34 has a sampling frequency of ½, the number of taps can be reduced from 824 taps (=1024−100−100) to 412, if the response time remains unchanged. Thus, the total number of taps of the filters 32 and 34 can decrease to 512 (100+412).

Now, that the number of taps of the digital filter 34 is so reduced, the digital signal processing circuits 30L and 30R can be of a smaller scale. If the circuits 30L and 30R are DSPs, the memories, i.e., delay circuits 321 and delay circuits 341, need to have but a smaller storage capacity. The IC scale of either digital signal processing circuit can be reduced. Hence, the manufacturing cost of the digital signal processing circuits 30L and 30R can be decreased, and so can be the power consumption of the circuits 30L and 30R.

Using the digital filters incorporated in the digital signal processing circuits 30L and 30R, the headphone 6 provides an acoustic image that lies outside the head of the listener who wears it. Since the circuits 30L and 30R can be manufactured at low cost, it is possible to lower the manufacturing cost of the headphone apparatus.

Figure 10:
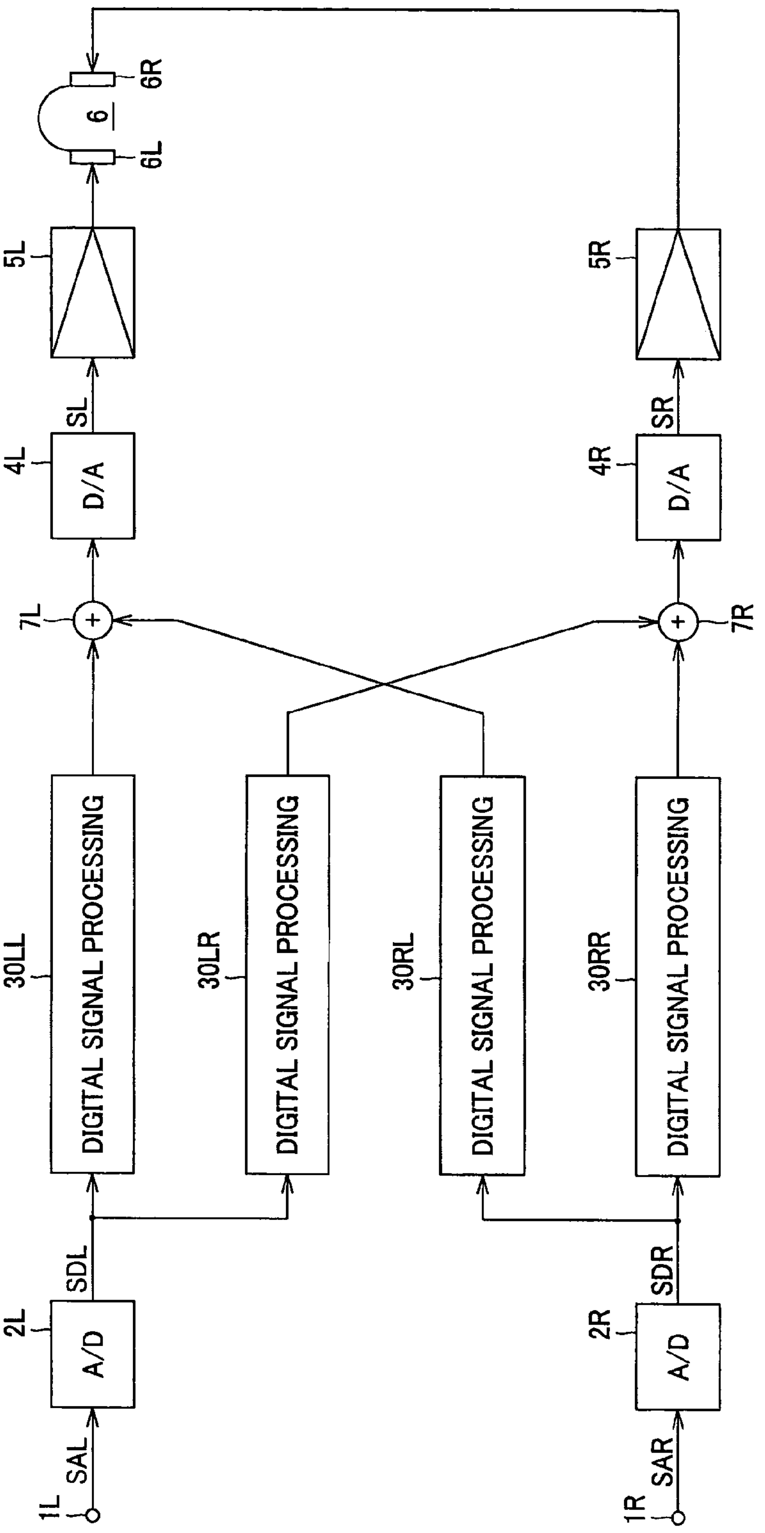
FIG. 10 is a block diagram of a headphone apparatus that reproduces sound from a two-channel stereophonic, audio signal.

FIG. 10 is a block diagram of a headphone apparatus that reproduces sound from a two-channel stereophonic, audio signal. Like the headphone apparatus of FIG. 4, this headphone apparatus is designed to position an acoustic image outside the listener's head. It incorporates digital signal processing apparatus according to this invention, too. Thus, the filters used in the apparatus have far fewer taps, i.e., delay circuits and multiplier circuits, than the conventional filter (FIG. 3).

As shown in FIG. 10, a left-channel analog audio signal SAL and a right-channel analog audio signal SAR are supplied via input terminals 1L and 1R to A/D converter circuits 2L and 2R, respectively. The A/D converter circuit 2L converts the signal SAL to a digital audio signal SDL. The A/D converter circuit 2R converts the signal SAR to a digital audio signal SDR. The signal SDL is supplied to digital signal processing circuits 30LL and 30LR. The signal SDR is supplied to digital signal processing circuits 30RL and 30RR.

The digital signal processing circuits 30LL, 30LR, 30RL and 30RR have the same configuration as the digital signal processing circuits 30L and 30R illustrated in FIG. 6. The circuits 30LL, 30LR, 30RL and 30RR processes the audio signals SL and SR, generating signals from which a headphone 6 reproduces the audio signals SDL and SDR to provide an acoustic field similar to one provided by speakers, or an acoustic image lying outside the listener's head.

Figure 11:
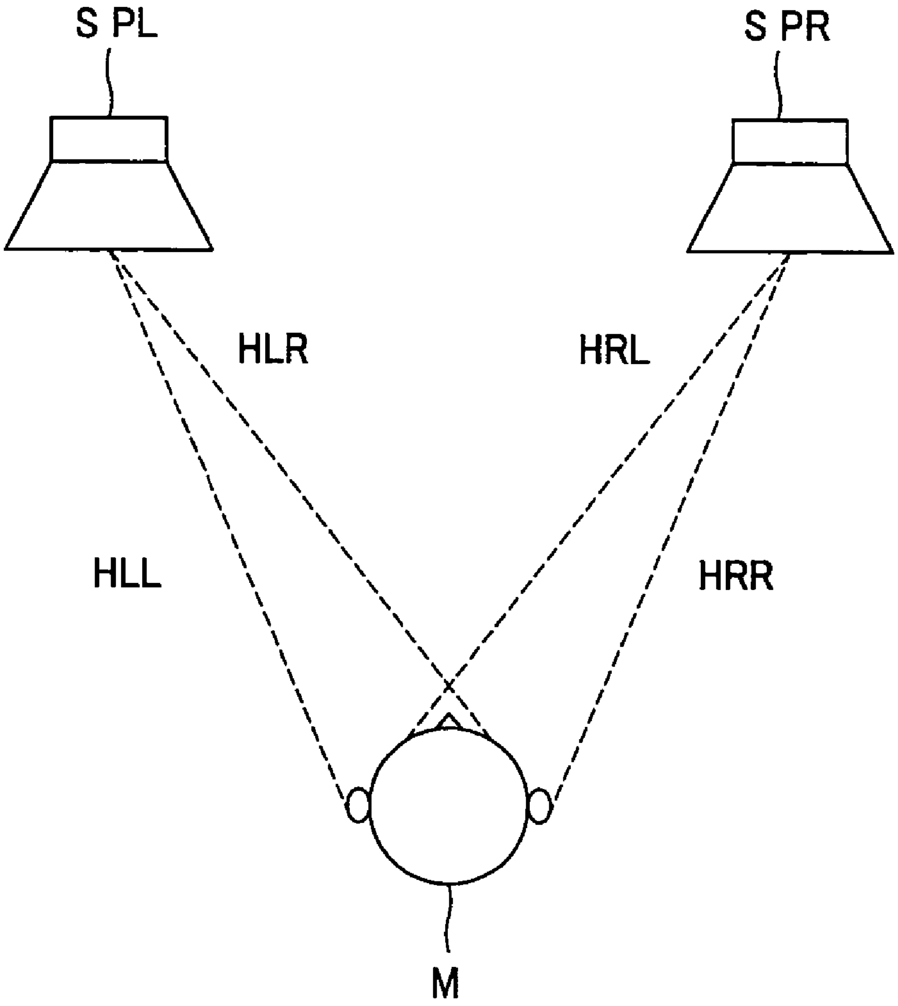
FIG. 11 shows a system in which sound sources SPL and SPR are arranged at a front-left and a front-right position of a listener M, respectively.

In a system shown in FIG. 11, which comprises sound sources SPL and SPR arranged at a front-left and a front-right position of a listener M, respectively, the sound output from the source SPL propagates to the listener's left ear along a path having transfer function HLL and to the listener's right ear along a path having transfer function HLR. On the other hand, the sound output from the source SPR propagates to the listener's left ear along a path having transfer function HRL and to the listener's right ear along a path having transfer function HRR. Transfer functions HLL, HLR, HRL and HRR are defined as follows:

HLL: Function of transfer from source SPL to the left ear

HLR: Function of transfer from source SPL to the right ear

HRL: Function of transfer from source SPR to the left ear

HRR: Function of transfer from source SPR to the right ear

The digital signal processing circuit 30LL convolutes an impulse response in the signal SDL, the response having been obtained by converting the transfer function HLL to a time axis. The digital signal processing circuit 30LR convolutes an impulse response in the signal SDL, this response having been obtained by converting the transfer function HLR to a time axis. The digital signal processing circuit 30RL convolutes an impulse response in the signal SDR, the response having been obtained by converting the transfer function HRL to a time axis. The digital signal processing circuit 30RR convolutes an impulse response in the signal SDR, the response having been obtained by converting the transfer function HRR to a time axis. The output signals of the digital signal processing circuits 30LL and 30RL are supplied to an adder circuit 7L and added together. The output signals of the digital signal processing circuits 30LR and 30RR are supplied to an adder circuit 7R and added together. The output signals of the adder circuits 7L and 7R are supplied to D/A converter circuits 4L and 4R, respectively. The D/A converter circuit 4L converts the input signal to an analog audio signal SL. The D/A converter circuit 4R converts the input signal to an analog audio signal SR. The signals SL and SR are supplied through the headphone amplifiers 5L and 5R to the left and right acoustic units 6L and 6R of the headphone 6, respectively.

Thus, the headphone 6 provides an acoustic field similar to one provided when two speakers arranged at a front-left position and a front-right position of a listener M, are supplied with the audio signals SAL and SAR, respectively. As a result, an acoustic image lies outside the listener's head.

As specified above, the digital signal processing circuits 30LL, 30LR, 30RL and 30RR have the same configuration as the digital signal processing circuits 30L and 30R illustrated in FIG. 6. The digital signal processing circuits 30LL, 30LR, 30RL and 30RR can be of a smaller scale. The circuit size of each digital signal processing circuit can be reduced. Hence, the manufacturing cost of the digital signal processing circuits 30LL, 30LR, 30RL and 30RR can be decreased, and so can be the power consumption of the circuits 30LL, 30LR, 30RL and 30RR.

Figure 12:
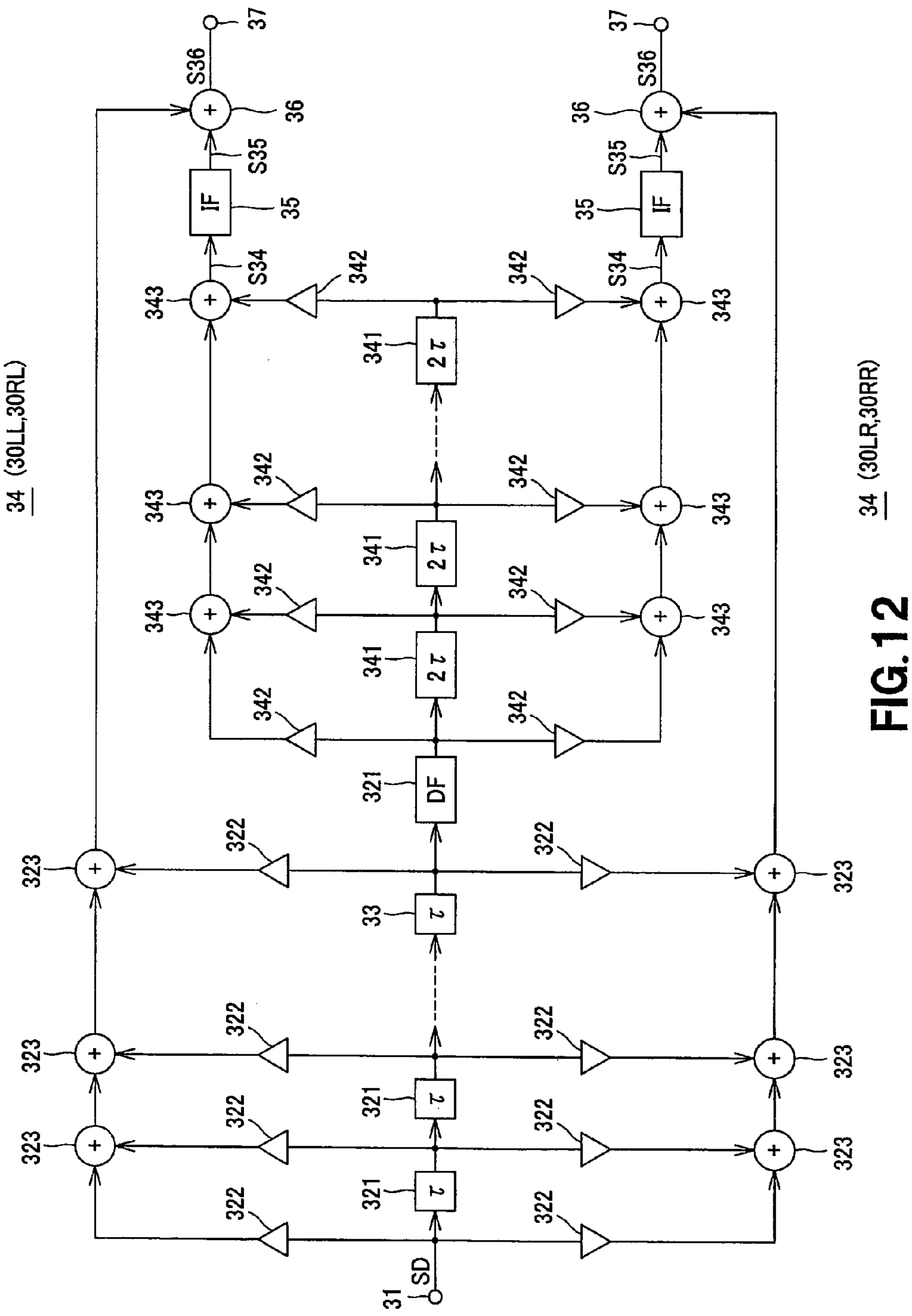
FIG. 12 is a diagram illustrating the digital signal processing apparatus used in a headphone apparatus that reproduces sound from a two-channel stereophonic, audio signal.

The digital signal processing circuits 30LL and 30RL may constitute a configuration 34 shown in FIG. 12. The digital signal processing circuits 30LR and 30RR may constitute an identical configuration 34 (FIG. 12).

As seen from FIGS. 4 and 6, the delay circuits 321, delay circuits 341 and decimation filter 33 of the digital signal processing circuit 30L process the same signals that are processed by the delay circuits 321, delay circuits 341 and decimation filter 33 of the digital signal processing circuit 30R. Therefore, the digital signal processing circuits 30L and 30R can share the delay circuits 321, the delay circuits 341 and the decimation filter 33, as is illustrated in FIG. 12.

For the same reason, the digital signal processing circuits 30LL and 30LR can share delay circuits 321, delay circuits 341 and a decimation filter 33. Moreover, the digital signal processing circuits 30RL and 30RR can share delay circuits 321, delay circuits 341 and a decimation filter 33. Further, this invention can be applied to multi-channel stereophonic audio signals (e.g., four-channel stereophonic audio signals or stereophonic audio signals for more channels).

The headphone apparatus of FIG. 10 incorporates such digital filters, positioning the acoustic image outside the listener's head. It can therefore be manufactured at low cost.

Figure 13:
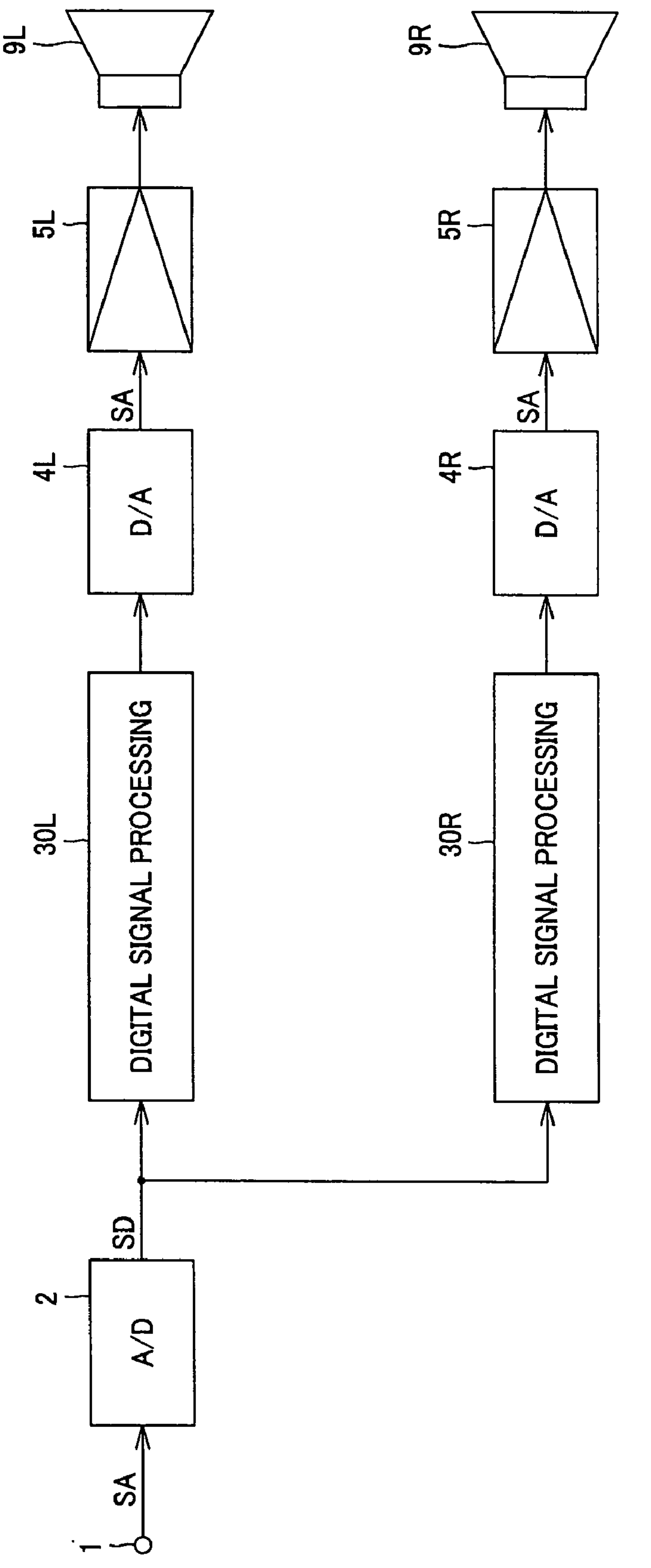
FIG. 13 is a block diagram of a digital signal processing apparatus designed to make two speakers form an acoustic image at a given position.

FIG. 13 depicts a digital signal processing circuit designed to make two speakers form an acoustic image at a given position. As FIG. 13 shows, an analog audio signal SA is supplied via the input terminal 1 to an A/D converter circuit 2. The circuit 2 converts the signal SA to a digital audio signal SD. The signal SD is supplied to digital signal processing circuits 30L and 30R. The digital signal processing circuit 30L convolutes an impulse response in the signal SD, the response having been obtained by converting a transfer function to a time axis. The digital signal processing circuit 30R convolutes an impulse response in the signal SD, the response having been obtained by converting a transfer function to a time axis. (The transfer functions will be described later.)

The output signals of the digital signal processing circuit 30L and 30R are supplied to D/A converter circuits 4L and 4R, respectively. The circuits 4L and 4R convert the input signals to analog audio signals SA. The analog audio signals SA are supplied via speaker amplifiers 8L and 8R to the left-channel speaker 9L and right-channel speaker 9R, respectively.

Figure 14:
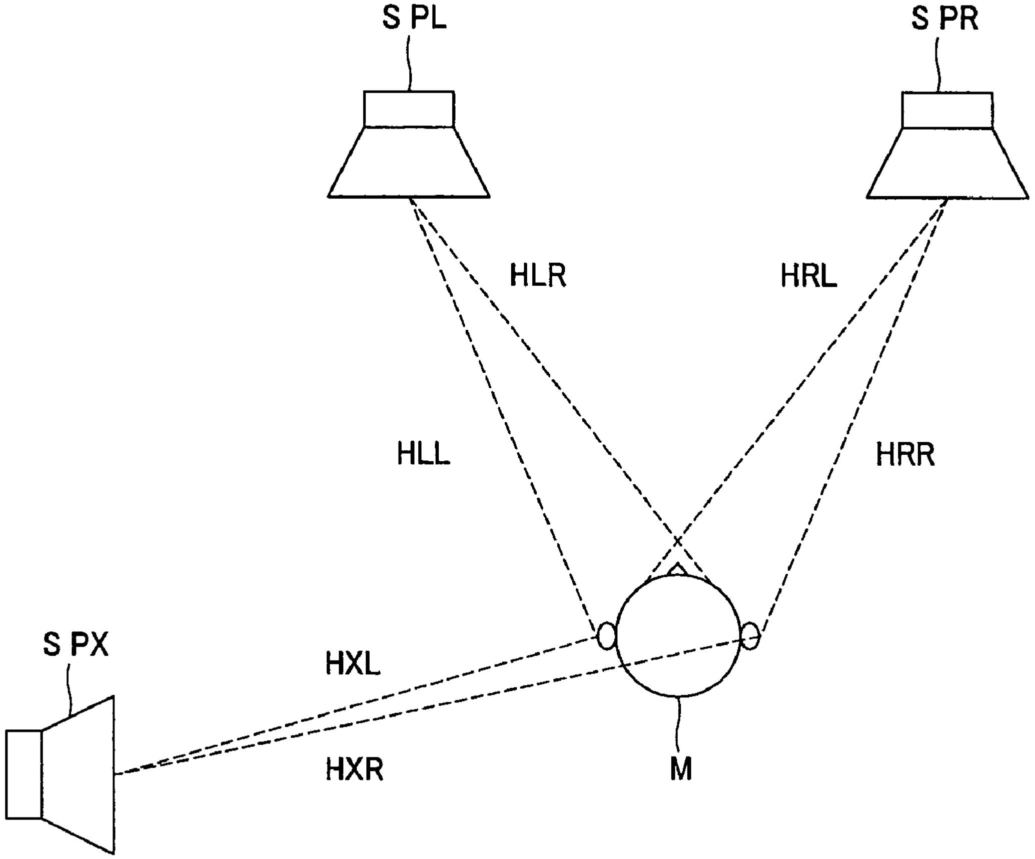
FIG. 14 shows a system in which sound sources SPL and SPR are arranged at a front-left and a front-right position of a listener M, respectively, thereby reproducing an equivalent sound source SPX at a given position.

The digital signal processing circuit 30L and 30R processes the digital audio signal SD in a specific manner as will be described below. In a system shown in FIG. 14, which comprises sound sources SPL and SPR arranged at a front-left position and a front-right position of a listener M, respectively, a sound source SPX is reproduced at any desired position. The system has the following six transfer functions:

HLL: Function of transfer from source SPL to the left ear
HLR: Function of transfer from source SPL to the right ear
HRL: Function of transfer from source SPR to the left ear
HRR: Function of transfer from source SPR to the right ear
HXL: Function of transfer from source SPX to the left ear
HXR: Function of transfer from source SPX to the right ear The sound sources SPL and SPR can then be defined as follows:

$$SPL=(HXL\times HRR-HXR\times HRL)/(HLL\times HRR-HLR\times HRL)\times SPX \quad (1)$$

$$SPR=(HXR\times HLL-HXL\times HLR)/(HLL\times HRR-HLR\times HRL)\times SPX \quad (2)$$

Thus, an audio signal SXA pertaining to the sound source SPX may be supplied via a filter providing the transfer function of the equation (1), to a speaker that is located at the source SPL, and via a filter providing the transfer function of the equation (2), to a speaker that is located at the source SPR. Then, the acoustic image defined by the audio signal SX can be positioned at the sound source SPX.

The digital signal processing circuit 30L convolutes an impulse response in the digital audio signal SD, the response having been obtained by converting the transfer-function term of the equation (1) to a time axis. Similarly, the digital signal processing circuit 30R convolutes an impulse response in the digital audio signal SD, the response having been obtained by converting the transfer-function term of the equation (2) to a time axis. Note that the digital signal processing circuits 30L and 30R are of the same configuration as shown in FIG. 6. Thus, the acoustic image defined by the analog audio signal SA can be provided at the sound source SPX.

The digital signal processing circuits 30L and 30R can have the same configuration as depicted in FIG. 6. The circuit size of each digital signal processing circuit can be reduced. Hence, the manufacturing cost of the digital signal processing circuits 30L and 30R can be decreased, and so can be the power consumption of the circuits 30L and 30R.

The digital signal processing circuits 30L and 30R can share the delay circuits 321, the delay circuits 341 and the decimation filter 33, in the same way as illustrated in, for example, FIG. 12.

For the same reason, the digital signal processing circuits 30LL and 30LR can share delay circuits 321, delay circuits 341 and a decimation filter 33. In addition, the digital signal processing circuits 30RL and 30RR can share delay circuits 321, delay circuits 341 and a decimation filter 33.

Further, this invention can be applied to multi-channel stereophonic audio signals (e.g., four-channel stereophonic audio signals or stereophonic audio signals for more channels).

Figure 15:
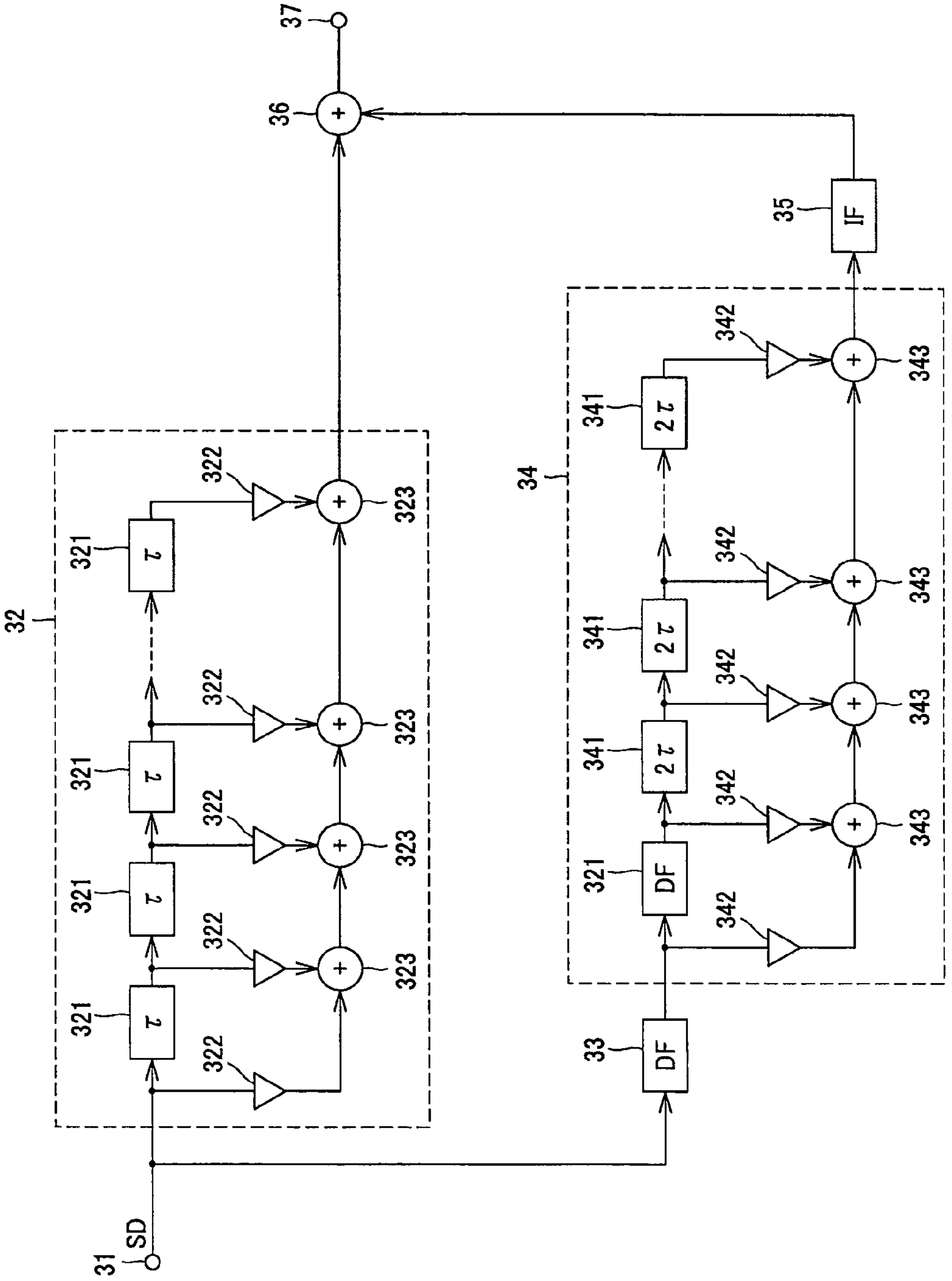
FIG. 15 is a circuit diagram of a digital signal processing circuit that is used in another embodiment of this invention.

FIG. 15 shows a digital signal processing circuit that is used in another embodiment of this invention. This digital signal processing circuit differs from the digital signal processing circuits 30L and 30R shown in FIG. 4, in some respects. That is, a down-sampling filter 33 that changes the first sampling rate to the second sampling rate is connected to the input of the second digital filter 34, and an up-sampling filter 35 that changes the second sampling rate back to the first sampling rate is connected to the output of the second digital filter 34. Thus, the sampling filter 33 and 35 connect the second digital filter 34 in parallel to the first digital filter 32. The reflected acoustic part of the second response part is delayed by the delay time defined by the down-sampling filter 33 and up-sampling filter 35.

The digital audio signal SD output from the A/D converter circuit 2 is supplied via the input terminal 31 to the first digital filter 32. The first digital filter 32 reproduces that part of the impulse response, which responds faster, i.e., direct acoustic part. The direct acoustic part is supplied to an adder 36.

The digital audio signal SD is supplied to the decimation filter 33, too. The decimation filter 33 samples the signal SD at a low sampling rate. The signal SD thus processed is supplied to the second digital filter 34. An impulse response corresponding to that part of the impulse response, which responds more slowly, i.e., reflected acoustic part, is convoluted in the signal SD. The signal SD is supplied to the interpolation filter 35. The interpolation filter 35 changes the sampling rate of the signal SD back to the original rate. The output signal of the interpolation filter 35 is supplied to the adder circuit 36. If the adder circuit 36 adds the signals supplied from the first digital filter 32 and the interpolation filter 35, the impulse responses provided by the filters 32 and 34 will overlap, and a desired impulse response cannot be reproduced.

To reproduce a desired impulse response, the decimation filter and interpolation filter are constituted by FIR filters that have constant group-delay characteristic. The decimation filter and interpolation filter therefore have a delay time almost equal to a time that elapses until the reflected acoustic part of the impulse response is reproduced. More precisely, the decimation filter and interpolation filter therefore have a delay time that is the sum of the direct acoustic part (a) and anacoustic part (b) that are illustrated in FIG. 5.

Figure 16:
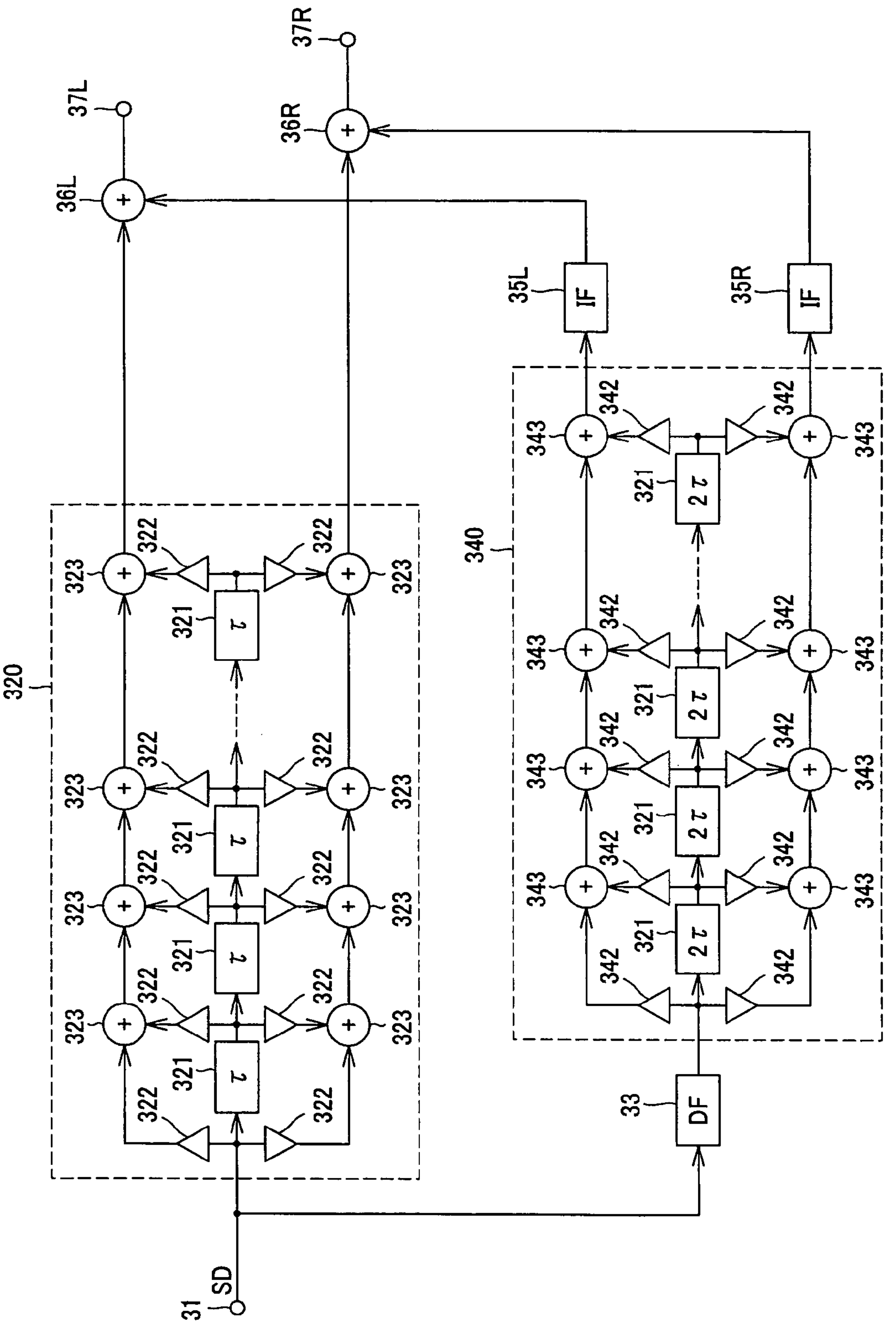
FIG. 16 is a modification of the digital signal processing circuit shown in FIG. 15, which is incorporated in a headphone apparatus that reproduces sound from a two-channel stereophonic, audio signal.

No coefficients need to be convoluted in the anacoustic part of the impulse response. The anacoustic part only needs to be delayed. The decimation filter 33 and interpolation filter 35 may be configured to have a delay time including the entire anacoustic part or a part thereof. The digital signal processing circuits 30L and 30R may be combined to provide a configuration shown in FIG. 16, in the headphone apparatus of FIG. 10, which reproduce two-channel stereophonic audio signals and which is therefore equivalent to the sound sources SPL and SPR arranged as shown in FIG. 11.

In the embodiments described above, the delay time of the decimation filter 33 and interpolation filter 35 is applied to provide an anacoustic part and distinguished from the delay time of the digital filter 34. Nonetheless, this invention is not limited to the embodiments. The decimation filter 34 may include a part of the decimation filter 34 and a part of the interpolation filter 35.

A part of the digital filter 34, which generates a reflected acoustic part of the impulse response, may be incorporated into a part of the decimation filter 34 and/or a part of the interpolation filter 35.

In the embodiments described above, the decimation filter 33 and interpolation filter 35 are FIR filters. Instead, they may be other types of filters having constant group-delay characteristic, such as IIR filters or ladder-type filters.

What is claimed is:

1. A digital signal processing apparatus for reproducing an impulse response that represents an acoustic transfer characteristic, the apparatus comprising:

a first digital filter that reproduces, at a first sampling rate, a direct acoustic part of the impulse response;

a second digital filter that reproduces, at a second sampling rate different than the first sampling rate, a reflected acoustic part of the impulse response; and a sampling-rate changing filter having a constant group-delay time characteristic and including at least one plurality of series-connected delay circuits, each one of the delay circuits providing a respective delay of one sampling period, the number of such delay circuits in the at least one plurality of delay circuits being determined by a duration of an anacoustic part of the impulse response and being a particular value that results in the delay circuits combining to delay a start of the reflected acoustic part of the impulse response for a specific delay time that is substantially equal to the duration of the anacoustic part of the impulse response, the anacoustic part of the impulse response thereby being reproduced between an end of the direct acoustic part of the impulse response and the start of the reflected acoustic part of the impulse response.

2. The digital signal processing apparatus according to claim 1, wherein the second sampling rate has a value that is 1/n (n having a value of at least 2) that of the first sampling rate.

3. The digital signal processing apparatus according to claim 2, wherein the sampling-rate changing filter comprises a down-sampling filter that decreases the first sampling rate to the second sampling rate, and an up-sampling filter that increases the second sampling rate to the first sampling rate; and the down-sampling filter and the up-sampling filter provide the specific delay time.

4. The digital signal processing apparatus according to claim 3, wherein a delayed output of the first digital filter is supplied to the down-sampling filter, an output of the down-sampling filter is supplied to the second digital filter, an output of the second digital filter is supplied to the up-sampling filter, and the output of the first digital filter and an output of the up-sampling filter are added, generating a signal which is outputted from the digital signal processing apparatus.

5. The digital signal processing apparatus according to claim 3, wherein an input signal is supplied to the first digital filter and the down-sampling filter, the output of the down-sampling filter is supplied to the second digital filter, a signal representing the second sampling rate is supplied to the up-sampling filter, and the output of the first digital filter and an output of the up-sampling filter are added, generating a signal which is outputted from the digital signal processing apparatus.

6. The digital signal processing apparatus according to claim 1, wherein the sampling-rate changing filter is a finite impulse response (FIR) filter.

7. A digital signal processing method for reproducing an impulse response that represents an acoustic transfer characteristic, the method comprising:

reproducing, using a first digital filter at a first sampling rate, a direct acoustic part of the impulse response;

reproducing, using a second digital filter at a second sampling rate different than the first sampling rate, a reflected acoustic part of the impulse response; and delaying a start of the reflected acoustic part of the impulse response for a specific delay time using a sampling-rate changing filter having a constant group-delay time characteristic and including at least one plurality of series-connected delay circuits, each one of the delay circuits providing a respective delay of one sampling period, the number of such delay circuits in the at least one plurality of delay circuits being determined by a duration of an anacoustic part of the impulse response and being a particular value that results in the specific delay time being substantially equal to the duration of the anacoustic part of the impulse response so that the anacoustic part of the impulse response is reproduced between an end of the direct acoustic part of the impulse response and the start of the reflected acoustic part of the impulse response.

8. A headphone apparatus having a digital signal processing apparatus for reproducing an impulse response that represents an acoustic transfer characteristic, the apparatus comprising:

a first digital filter that reproduces, at a first sampling rate, a direct acoustic part of the impulse response;

a second digital filter that reproduces, at a second sampling rate different than the first sampling rate, a reflected acoustic part of the impulse response; and a sampling-rate changing filter having a constant group-delay time characteristic and including at least one plurality of series-connected delay circuits, each one of the delay circuits providing a respective delay of one sampling period, the number of such delay circuits in the at least one plurality of delay circuits being determined by a duration of an anacoustic part of the impulse response and being a particular value that results in the delay circuits combining to delay a start of the reflected acoustic part of the impulse response for a specific delay time that is substantially equal to a duration of an anacoustic part of the impulse response, the anacoustic part of the impulse response thereby being reproduced between an end of the direct acoustic part of the impulse response and the start of the reflected acoustic part of the impulse response.

9. The headphone apparatus according to claim 8, wherein the second sampling rate has a value that is 1/n (n having a value of at least 2) that of the first sampling rate.

10. The headphone apparatus according to claim 9, wherein the sampling-rate changing filter comprises a down-sampling filter that decreases the first sampling rate to the second sampling rate, and an up-sampling filter that increases the second sampling rate to the first sampling rate; and the down-sampling filter and the up-sampling filter provide the specific delay time.

11. The headphone apparatus according to claim 10, wherein a delayed output of the first digital filter is supplied to the down-sampling filter, an output of the down-sampling filter is supplied to the second digital filter, an output of the second digital filter is supplied to the up-sampling filter, and the output of the first digital filter and an output of the up-sampling filter are added, generating a signal which is outputted from the digital signal processing apparatus.

12. The headphone apparatus according to claim 10, wherein an input signal is supplied to the first digital filter and the down-sampling filter, the output of the down-sampling filter is supplied to the second digital filter, a signal representing the second sampling rate is supplied to the up-sampling filter, and the output of the first digital filter and an output of the up-sampling filter are added, generating a signal which is outputted from the digital signal processing apparatus.

13. The headphone apparatus according to claim 8, wherein the sampling-rate changing filter is a finite impulse response (FIR) filter.

* * * * *